United States Patent
Noebauer et al.

(10) Patent No.: US 8,907,418 B2
(45) Date of Patent: Dec. 9, 2014

(54) SEMICONDUCTOR DEVICE

(71) Applicant: Infineon Technologies Austria AG, Villach (AT)

(72) Inventors: Gerhard Noebauer, Villach (AT); Christoph Kadow, Neuried (DE); Donald Dibra, Munich (DE); Robert Illing, Villach (AT)

(73) Assignee: Infineon Technologies Austria AG, Villach (AT)

( * ) Notice: Subject to any disclaimer, the term of this patent is extended or adjusted under 35 U.S.C. 154(b) by 28 days.

(21) Appl. No.: 13/888,546

(22) Filed: May 7, 2013

(65) Prior Publication Data

US 2014/0332881 A1    Nov. 13, 2014

(51) Int. Cl.
*H01L 29/78*    (2006.01)
*H01L 27/088*   (2006.01)
*H01L 27/105*   (2006.01)

(52) U.S. Cl.
CPC .......... *H01L 27/088* (2013.01); *H01L 29/7827* (2013.01); *H01L 27/105* (2013.01)
USPC ....................................................... 257/334

(58) Field of Classification Search
USPC ....................................................... 257/334
See application file for complete search history.

(56) References Cited

U.S. PATENT DOCUMENTS

| 6,503,786 | B2 |  | 1/2003 | Klodzinski | |
|---|---|---|---|---|---|
| 8,084,821 | B2 |  | 12/2011 | Dibra et al. | |
| 8,450,810 | B2 | * | 5/2013 | Takeda | 257/397 |
| 2003/0173619 | A1 | * | 9/2003 | Feldtkeller et al. | 257/330 |
| 2012/0025305 | A1 | * | 2/2012 | Takeda | 257/334 |
| 2012/0049273 | A1 | * | 3/2012 | Hirler et al. | 257/330 |
| 2014/0015046 | A1 | * | 1/2014 | Thiele et al. | 257/334 |

FOREIGN PATENT DOCUMENTS

| DE | 10246960 A1 | 4/2004 |
|---|---|---|
| DE | 10324754 A1 | 1/2005 |
| DE | 102004046630 A1 | 3/2006 |
| DE | 102009046181 A1 | 5/2010 |

* cited by examiner

*Primary Examiner* — Thao P Le
(74) *Attorney, Agent, or Firm* — Murphy, Bilak & Homiller, PLLC

(57) ABSTRACT

A semiconductor device includes a transistor array, including first transistors and second transistors. Gate electrodes of the first transistors are disposed in first trenches in a first main surface of a semiconductor substrate, and gate electrodes of the second transistors are disposed in second trenches in the first main surface. The first and second trenches are disposed in parallel to each other. The semiconductor device further includes a first gate conductive line in contact with the gate electrodes in the first trenches, a second gate conductive line in contact with the gate electrodes in the second trenches, and a control element configured to control the potential applied to the second gate conductive line.

25 Claims, 11 Drawing Sheets

SEMICONDUCTOR DEVICE

BACKGROUND

MOS (Metal Oxide Semiconductor) power transistors or MOS power devices which are commonly employed in automotive and industrial electronics, are usually optimized in accordance for the applications for which they are employed. For example, they should have a low on-state resistance ($R_{on} \cdot A$) when being switched on. Further, there are applications, in which the power transistors are employed as protective elements. When being employed as protective elements, the ability of dissipating power should be increased.

Attempts are being made in order to further improve the characteristics of a power transistor in order to optimize its performance in various applications.

SUMMARY

According to an embodiment, a semiconductor device comprises a transistor array including first transistors and second transistors. Gate electrodes of the first transistors are disposed in first trenches in a first main surface of a semiconductor substrate, and gate electrodes of the second transistors are disposed in second trenches in the first main surface. The semiconductor device further comprises a first gate conductive line in contact with the gate electrodes in the first trenches, a second gate conductive line in contact with the gate electrodes in the second trenches, and a control element configured to control the potential applied to the second gate conductive line.

According to a further embodiment, a semiconductor device comprises a transistor array including first transistors and second transistors, each of the first and second transistors comprising a gate electrode. The gate electrodes of the first transistors are disposed in first trenches in a first main surface of a semiconductor substrate, and the gate electrodes of the second transistors are disposed in second trenches in the first main surface, the first and the second trenches being disposed in parallel to each other. The semiconductor device further comprises a first gate conductive line in contact with the gate electrodes in the first trenches, a second gate conductive line in contact with the gate electrodes in the second trenches, a source terminal, a drain terminal, a first gate terminal in contact with the first gate conductive line, and a second gate terminal in contact with the second gate conductive line.

According to an embodiment, an integrated circuit comprises a semiconductor device including a transistor array. The transistor array comprises first transistors and second transistors. Gate electrodes of the first transistors are disposed in first trenches in a first main surface of a semiconductor substrate, and gate electrodes of the second transistors are disposed in second trenches in the first main surface. The semiconductor device further comprises a first gate conductive line in contact with the gate electrodes in the first trenches, a second gate conductive line in contact with the gate electrodes in the second trenches, and a control element configured to control the potential applied to the second gate conductive line.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the disclosure and are incorporated in and constitute a part of this specification. The drawings illustrate the embodiments and together with the description serve to explain the principles. Other embodiments and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The terms "lateral" and "horizontal" as used in this specification intend to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As employed in this specification, the terms "coupled" and/or "electrically coupled" are not meant to mean that the elements must be directly coupled together intervening elements may be provided between the "coupled" or "electrically coupled" elements. The term "electrically connected" intends to describe a low-ohmic electric connection between the elements electrically connected together.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Figure 1A:
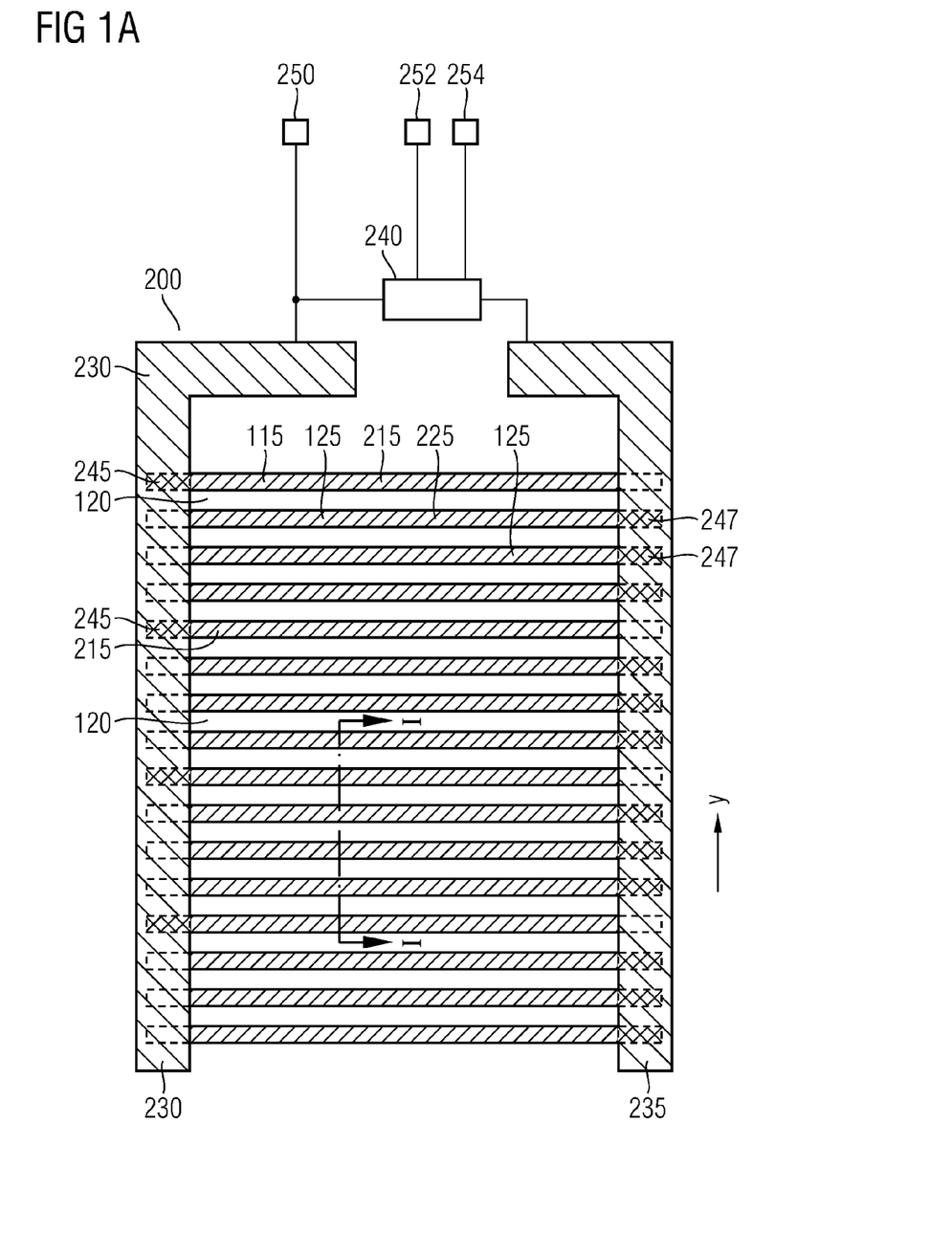
FIG. 1A shows a schematic plan view of a semiconductor device according to an embodiment.

FIG. 1A shows an example of a semiconductor device according to an embodiment. The semiconductor device shown in FIG. 1A includes a transistor array comprising first transistors and second transistors (further illustrated in FIG. 2). The semiconductor device shown in FIG. 1A comprises a plurality of first trenches 115 and a plurality of second trenches 125. The first and the second trenches 115, 125 are formed in a first main surface of a semiconductor substrate. Mesas 120 are disposed between adjacent trenches. Components of the first and second transistors are disposed within the mesa 120 and in the first and second trenches 115, 125 in a manner as will be further illustrated in FIG. 2. According to an embodiment, the first and the second trenches 115, 125 may be parallel to each other.

According to an embodiment, the number of first trenches 115 may be equal to the number of second trenches 125. The first and the second trenches may be arranged in an alternating order.

According to a further embodiment, the number of second trenches 125 may be larger than the number of first trenches 115. In this case, as is illustrated in FIG. 1A, one first trench 115 may be followed by several of the second trenches 125. For example, the first and the second trenches may be evenly or homogenously distributed.

First gate electrodes 215 of the first transistors are disposed in the first trenches 115, and second gate electrodes 225 of the second transistors are disposed in the second trenches 125. The first gate electrodes 215 disposed in the first trenches 115 may be connected with a first gate conductive line 230 by means of first contacts 245. Further, the second gate electrodes 225 disposed in the second gate trenches 125 may be connected with a second gate conductive line 235 by means of second contacts 247. For example, the first and the second gate conductive lines 230, 235 may be arranged in a direction perpendicular with respect to the extension direction of the first and second trenches 115, 125. The first and the second contacts 245, 247 and the first and the second gate conductive lines 230, 235 may be arranged at opposite sides of the first and second trenches 115, 125 to form an inter-digitated gate structure. Nevertheless, different arrangements are possible. For example, the first and the second gate conductive lines 230, 235 may be disposed at one side of the first and the second trenches 114, 125.

The semiconductor device 200 of FIG. 1A further comprises a control element 240 for controlling a potential applied to the second gate conductive line 235. The control element 240 is configured to control the potential applied to the second gate conductive line 235. According to an embodiment, the control element 240 may be configured to control the potential based on at least one of a signal between two terminals of the semiconductor device, a current flowing across the semiconductor device and a temperature of the semiconductor device.

For example, as is shown in FIG. 1A, the semiconductor device 200 may comprise a source terminal 252 and a drain terminal 254. A drain-source voltage may be applied between the drain terminal 254 and the source terminal 252. According to this embodiment, for example, the control element 240 may control the potential applied to the second gate conductive line 235 based on the drain-source voltage.

According to a further embodiment, the potential applied to the second gate conductive line 235 may be controlled based on the drain-source current. The semiconductor device 200 may further comprise a gate terminal 250. The first gate conductive line 230 may be connected with the gate terminal 250. According to an embodiment, the control element 240 may be connected with the gate terminal 250.

Figure 1B:
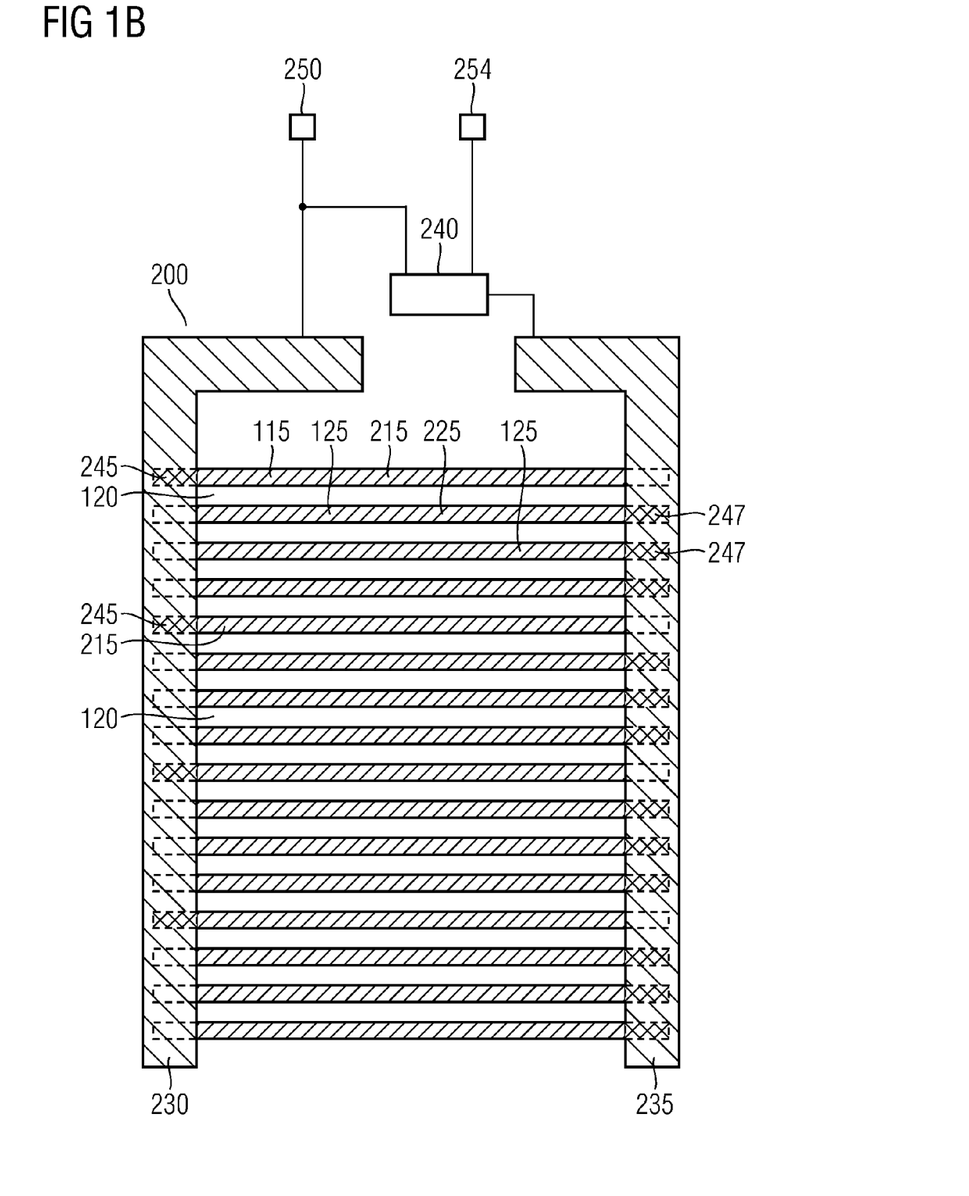
FIG. 1B shows a schematic plan view of a semiconductor device according to a further embodiment.

FIG. 1B shows an embodiment of the semiconductor device 200. The semiconductor device 200 of FIG. 1B is distinguished from the semiconductor device of FIG. 1A in that according to FIG. 1B the control element 240 is configured to control the potential applied to the second gate conductive line 235 based on a signal between the gate terminal 250 and the drain terminal 254, for example, the gate-drain voltage. The further elements of the embodiment of FIG. 1B are similar to corresponding elements of the semiconductor device of FIG. 1A.

Figure 1C:
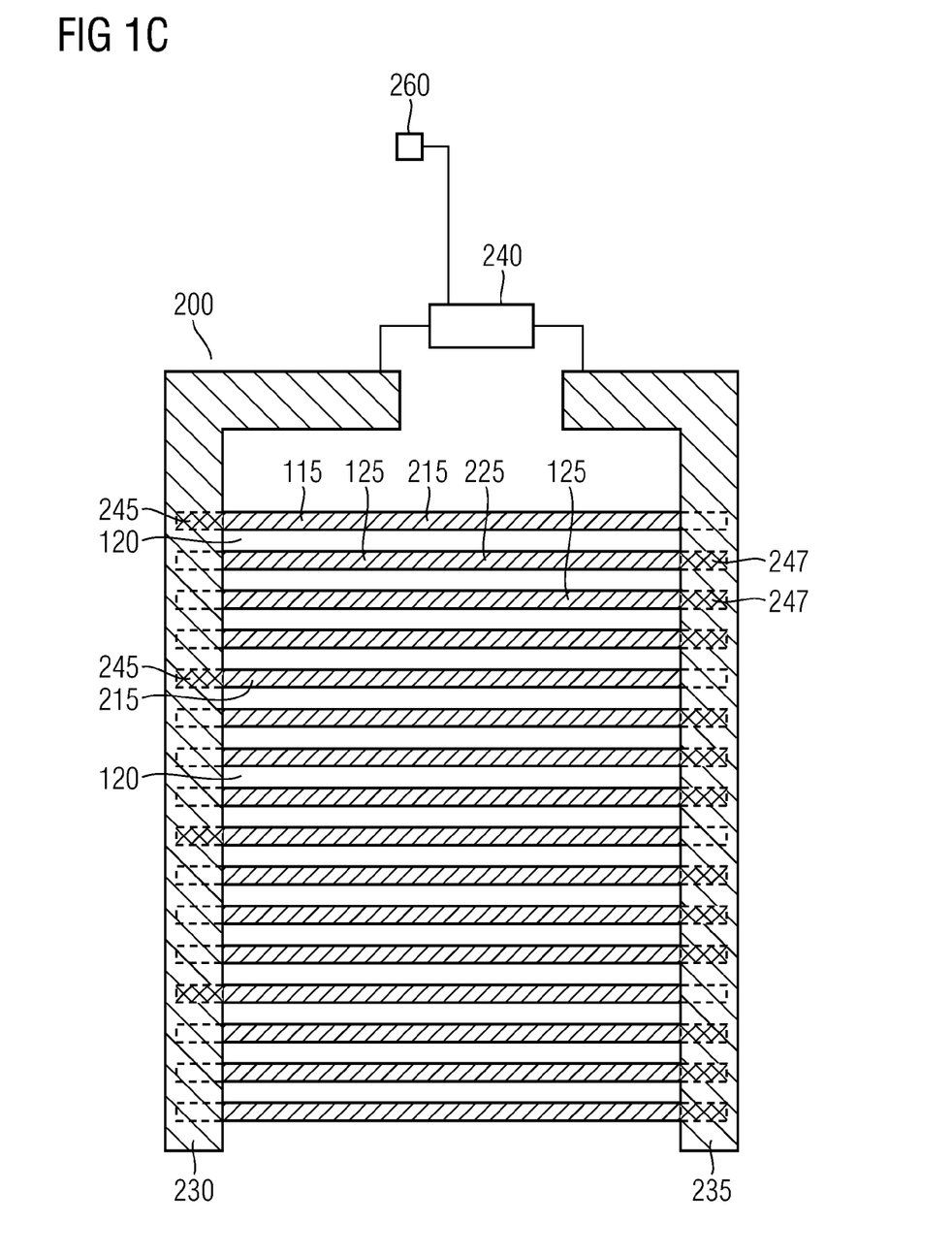
FIG. 1C shows a plan view of a semiconductor device according to still a further embodiment.

FIG. 1C illustrates a further embodiment. Differing from the embodiment of FIGS. 1A and 1C, a measurement signal 260 is fed to the control element 240. According to this embodiment a signal is measured within the semiconductor device 200. For example, as will be explained in more detail below with reference to FIG. 5, the voltage between the drain and source terminal ($V_{DS}$) may be measured and input into the control element 240. Further, the drain current $I_D$ may be measured and fed into the control element 240. According to this embodiment, the control element 240 is configured to control the potential applied to the second gate conductive line 235 based on the measurement signal 260 measured between two terminals of the semiconductor device.

As has been explained above, according to an embodiment the control element 240 is configured to control a potential applied to the second gate conductive line 235 of at least one of a signal between two terminals of the semiconductor device, a current flowing across the semiconductor device and a temperature of the semiconductor device. For example, the control element 240 may control the potential applied to the second gate conductive line 235 based on a drain-source voltage or a drain current applied to the semiconductor device 200. According to a further embodiment, the control element 240 may control the potential applied to the second gate conductive line 235 based on a gate-drain voltage applied between the first gate conductive line 230 and a drain terminal 254. According to a further embodiment, the control element 240 may be connected or integrated with a temperature sensor, and the potential applied to the second gate conductive line 235 may be controlled based on the sensed temperature.

As will be explained below with reference to FIGS. 5A to 5G, the control element 240 may include a transistor or several transistors, i.e. active devices, that may produce an output signal with more power in it than the input signal. According to an embodiment, the control element 240 is operable in two different states, namely, in an "on-state" in which a voltage greater than a threshold voltage of the second transistor is caused to be applied to the second gate electrode 225, and in an "off-state" in which a voltage smaller than the threshold voltage of the second transistor is caused to be applied to the second gate electrode 225.

Figure 2:
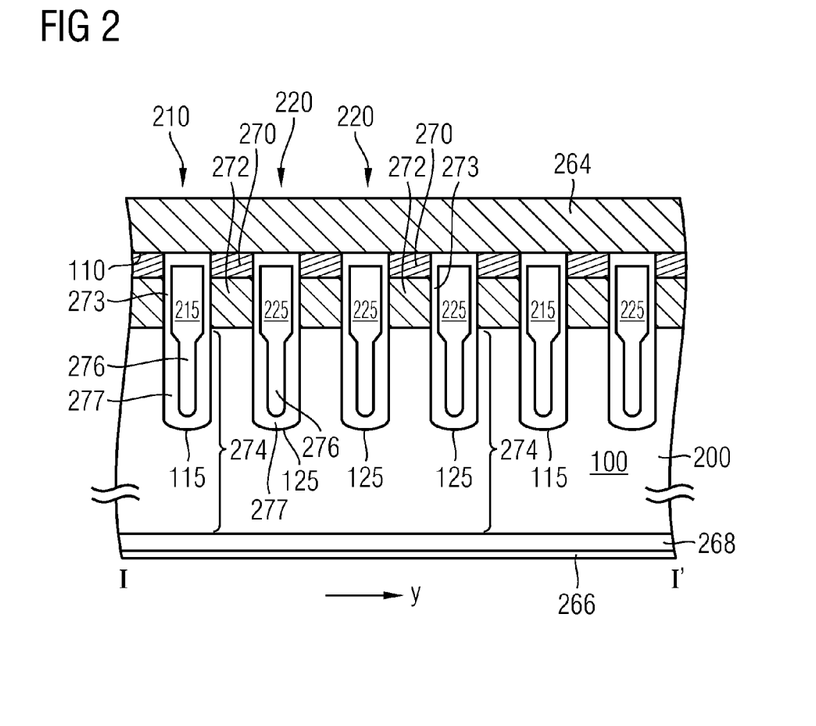
FIG. 2 shows a cross-sectional view of a portion of a semiconductor device according to an embodiment.

FIG. 2 illustrates a cross-sectional view of the semiconductor device shown in FIGS. 1A to 1C between I and I. The semiconductor device comprises a transistor array including first transistors 210 and second transistors 220. A first gate electrode 215 of the first transistor 210 is disposed in first trenches 115 and a second gate electrode 225 of the second transistor 220 is disposed in second trenches 125. A gate dielectric layer 273, for example, silicon oxide is disposed at the sidewalls of each of the first trenches 115 and the second trenches 125 so as to insulate the gate electrodes 215, 225 from the adjacent semiconductor material. A field plate 276 is arranged in the lower portion of each of the trenches 115, 125. The field plate 276 is insulated from the adjacent semiconductor material by a field dielectric layer 277. According to a further embodiment, the field plate 276 may be insulated from the first or second gate electrodes 215, 225.

A source region 270 of each of the first and the second transistors 210, 220 is disposed adjacent to the first main surface 110 of the semiconductor substrate. A source metallization layer 264 is disposed over the source regions 270. The source metallization layer 264 may be connected with the source terminal 252. Accordingly, the source region 270 may be connected with the source terminal 252. The source region 270 may, for example, be doped with dopants of the first conductivity type. Further, a body region 272 is disposed adjacent to the source region 270. The body region 272 may be doped with dopants of the second conductivity type. A drift region 274 is disposed between the body region 272 and the back side of the semiconductor substrate. The drift region 274 is doped with dopants of the first conductivity type. In an on-state, when a suitable voltage is applied to the first or second gate electrode 215, 225, a conductive channel is formed at the interface between the body region 272 and the adjacent gate dielectric layer 273. In this case a current may flow from the source region 270 via the conductive channel and the adjacent drift region 274 to the back side terminal of the device.

For example, as is illustrated in FIG. 2, a drain region 268 is disposed at a back side of the semiconductor substrate. A drain electrode 266 is disposed adjacent to the drain region 268. For example, the drain region 268 may be doped with dopants of the first conductivity type. The first and the second transistors 210, 220 are implemented as power MOSFETs. According to further embodiments, the transistors 210, 220 may instead be implemented as an alternative device, such as, for example, an IGBT ("insulated gate bipolar transistor") or others. The drain electrode 266 may be connected with the drain terminal 254. The first gate electrodes 215 may be connected with the first gate conductive line 230 in the manner illustrated in FIG. 1A to 1C, for example. Further, the second gate electrodes 225 may be connected with the second gate conductive line 235 in the manner illustrated in FIG. 1A to 1C, for example. The first gate conductive line 230 may be connected with the gate terminal 250. According to a further embodiment, the first gate conductive line 230 may be connected with the control element 240. Moreover, the second gate conductive line 235 is connected with the control element 240. The present power transistor is also referred to as a "split-gate power transistor" or "split-gate power MOSFET", since the gate electrodes are split between different transistor devices. Generally, a "split-gate power MOSFET" relates to a power MOSFET with common drain, common source and multiple gates in which each gate electrode controls a fraction of the power MOSFET channel width, $W_i$.

Most of the discussed transistors within this disclosure are NMOS devices, i.e. transistors comprising n doped source/drain regions and a p doped body regions. In these devices a current flows from the drain to the source region. As is clearly to be understood, according to further embodiments, the transistors may be implemented by PMOS devices in which the current flows from the source to the drain region.

Embodiments of the present specification may be implemented in various ways. For example, the control element 240 and transistor array may be formed in one single semiconductor substrate 100 as is also illustrated in FIG. 1. According to a further embodiment, the control element 240 may be implemented in a device that is separate from the transistor array. For example, the controller of the power transistor such as, for example, a Hot-Swap-controller or any other controller connected to the power transistor may include the control element 240. According to a further embodiment, the control element 240 may be implemented as a separate device, for example, an adapter which is disposed between a controller such as a Hot-Swap controller and the power transistor.

Figure 3:
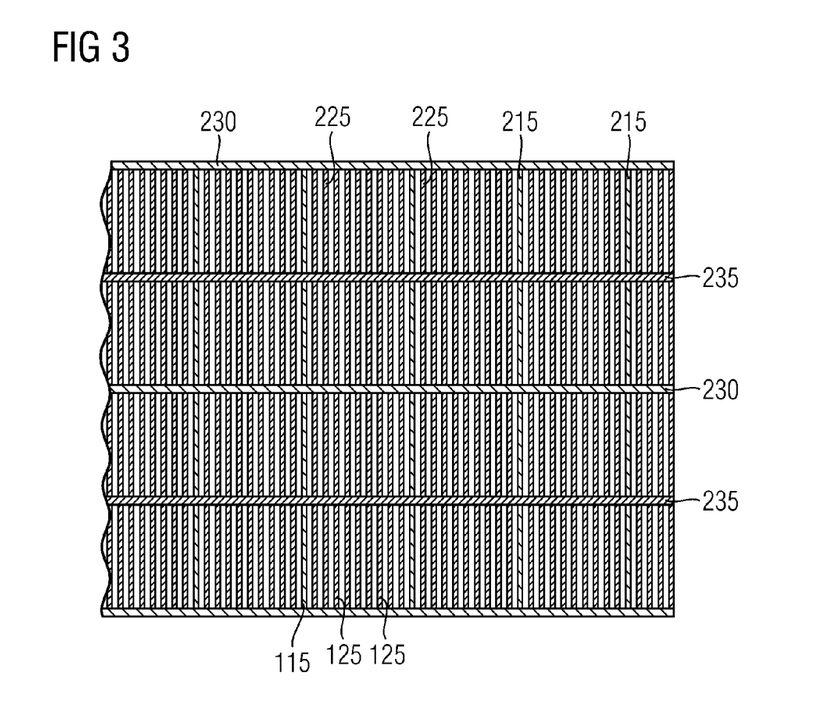
FIG. 3 shows a plan view of a portion of a semiconductor device according to an embodiment.

FIG. 3 shows an example of a layout of a semiconductor device 200 according to a further embodiment. As is shown, the semiconductor device comprises a plurality of first and second gate conductive lines 230, 235 that are arranged in an alternating manner. Due to the presence of a plurality of first gate conductive lines 230 and second gate conductive lines 235, the resistance of the gate electrodes may be further reduced. In the embodiment of FIG. 3, the second number of second trenches 125 is larger than the first number of first trenches 115. For example, the number of second trenches 125 may be approximately five-times the number of first trenches 115 or more. In the embodiment shown in FIG. 3, the number of second trenches 125 is approximately nine-times the number of first trenches 115.

In the following specific implementations of the basic semiconductor device illustrated in FIGS. 1 to 3 will be discussed in more detail.

Example 1

According to Example 1, the control element 240 may be configured to control the potential applied to the second gate conductive line 235 based on a signal between the source terminal 252 and the drain terminal 254 or a signal between the gate terminal 250 and the drain terminal 254. Depending on this signal, the second transistors 220 are switched on or switched off.

Generally, a power transistor may be used as a switch in so-called SMPS (Switched Mode Power Supply) topologies. In these relatively high frequency circuits, the switch is in an on-state or in an off-state. Attempts are made in order to decrease switching losses. To this end, switching from an off-state to an on-state or vice-versa is accomplished in a fast manner. Further, a power transistor may, for example, be also used as a dissipative element. Such a dissipative element minimizes power losses in an on-state and protects further circuit elements or the circuit board at special events. This may be useful when, for example, system components are exchanged during operation. This process is also referred to as "Hot-Swap". If, for example for maintenance or repairing purposes, a module such as, for example, a RAID drive is exchanged, high inrush currents would flow into the supporting capacitors at the input terminal of the module after inserting the drive into the main frame. In such a case, the current would only be limited by the resistivity of the lines of the circuit board. As a result, currents up to some hundred amperes would be possible. As a result, the module may be destroyed and the whole system may be put at risk. In order to avoid such a problem, the current may be correspondingly limited. In order to limit the current, a power MOSFET may be used as current limiter in linear operation.

Due to improvements of power transistors, for example, power MOSFETs in order to reduce the resistance $R_{ON}$, the steepness of the I-V characteristics of the power transistor per chip area, has remarkably increased. Due to this increase, the capability of dissipating power in linear operation has decreased. In this operation area the temperature coefficient $\partial I_D/\partial T$, i.e. the variation of current at a variation of temperature, is positive. As a result, this state may be instable. For example, a hotter spot within the chip will conduct more current, resulting in a temperature increase. Due to these effects, the chip may be locally molten and may be destroyed. Hence, it is attempted to limit the formation of hotspots within a semiconductor device.

As has been explained above with reference to FIGS. 1A to 1C, according to an embodiment, the control element 240 controls a potential applied to the second gate conductive line 235. As a consequence, for example, the second transistors 220 may be switched on and off in dependence from the applied drain-source voltage. At a low drain-source voltage both transistors 210, 220 are switched on, resulting in a reduced on-resistance. Further, at a drain-source voltage above a certain limit, the second transistor 220 is switched-off, resulting in reduced steepness of the transistor characteristics. In the following, this limit, at which the second transistors 220 are switched on, will be referred to as "switching voltage".

Figure 4:
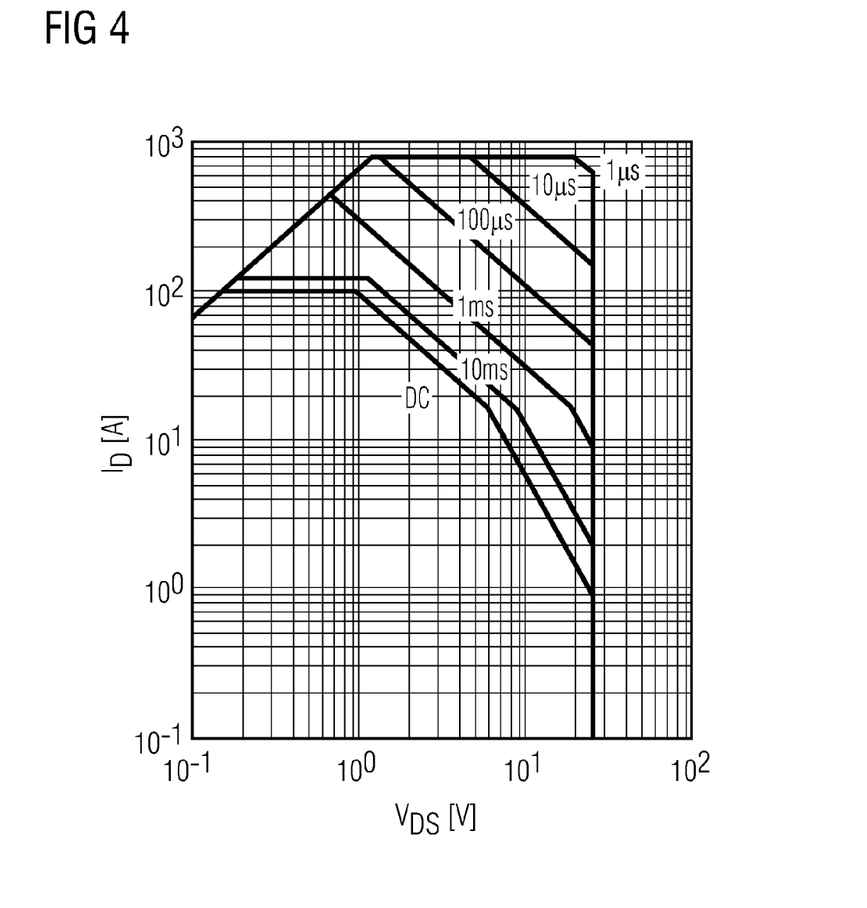
FIG. 4 illustrates a safe operating area of a semiconductor device according to an embodiment.

FIG. 4 illustrates an example of a safe operating area of a power transistor. The diagram shown in FIG. 4 illustrates thresholds or upper boundaries of the current in dependence from the source-drain voltage at different impulse durations. The purpose of this diagram is to determine the threshold of the current in order to prevent the device from failure due to overheating, for example. The diagram shown in FIG. 4 shows different operating states. For example, in the left-hand portion up to a drain-source voltage $V_{DS}$ of approximately 1 V, the current increases with the applied voltage. This part of the diagram relates to the switch-on operation, reflecting a state, in which the power transistor is switched on. The right-hand portion starting at a voltage $V_{DS}$ of approximately 1 V, refers to the linear operation in which the power transistor is used as a dissipative element.

According to an embodiment, depending on the applied drain-source voltage or the applied drain-gate voltage, only the first transistor 210 is operated or the first and the second transistors 210, 220 are operated. In more detail, at low drain-source voltages, the first and second transistors 210, 220 are operated, whereas at a voltage above a predetermined switching voltage the second transistor 220 is switched off. As a consequence, at a drain-source voltage above a switching voltage, the steepness of the transistor is reduced in order to prevent the formation of hot spots. Decreasing the transistor steepness results an increased capacity of dissipating power. On the other hand, at low drain-source voltages, the on-resistance is largely reduced.

According to an embodiment, the number of second trenches 125 in which the second gate electrodes 225 are disposed is approximately more than five times, for example, nine times the number of first trenches 115 in which the first gate electrodes 215 are disposed. Thereby, the behaviour of the device in the different voltage ranges can be adjusted more precisely.

Accordingly, by separating the two operating states depending on the drain-source voltage, the overall-performance of the power device may be improved. For example, in the diagram shown in FIG. 4, at a given drain-source voltage $V_{DS}$ and a given pulse duration higher currents $I_D$ are permissible. Hence, a higher amount of power may be dissipated.

Due to the special configuration, in which the transistor is separated into a first transistor and a second transistor which are arranged in a "comb-like" manner, the manufacturing process of this transistor may be made simple. Further according to this configuration, the first and the second gate electrodes may be distributed so that one of the first gate electrodes is surrounded by second gate electrodes. Thereby, the thermal resistivity around any of the gate electrodes is improved and the formation of hot spots may be prevented. In particular, the trenches in which no current is flowing, act as heat sinks for the trenches in which a current is flowing. The heat sinking is the more efficient, the more finely structured the gate is. For these reasons, employing the specific layout discussed above, at a drain-source voltage above the switching voltage, more power can be dissipated by the power transistor.

Figure 5A:
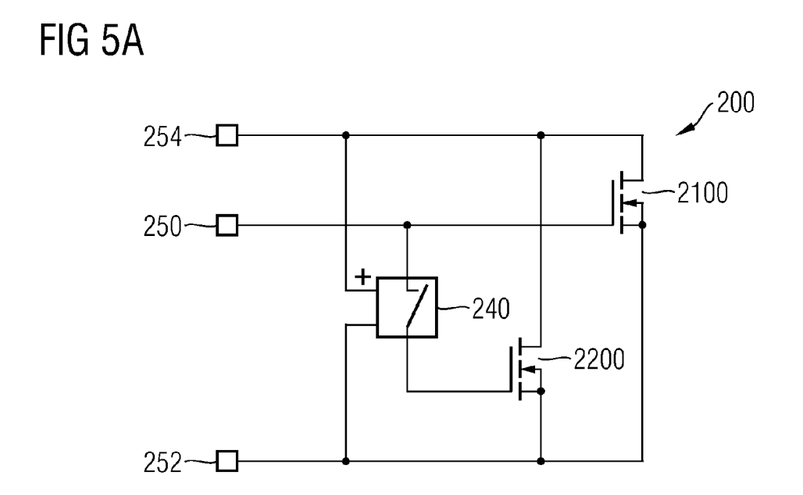
FIGS. 5A to 5G show examples of equivalent circuits representing the semiconductor device according to embodiments.

FIG. 5A shows a schematic circuit diagram of the semiconductor device 200 according to another embodiment. In FIG. 5A, the semiconductor device 200 comprises a first transistor element 2100 and a second transistor element 2200. The first transistor element 2100 comprises a plurality of first transistors, for example, in the manner as shown in FIGS. 1A to 1C and 2. The second transistor element 2200 comprises a plurality of second transistors, for example, in the manner illustrated in FIGS. 1A to 1C and 2. The semiconductor device 200 further comprises a source terminal 252, a drain terminal 254, a gate terminal 250 and a control element 240. The control element 240 is configured to control a potential applied to the second transistor element 2200. The control element 240 is connected with the source terminal 252 and the drain terminal 254. In dependence from the potential measured between the source terminal 252 and drain terminal 254, a potential is applied to the second transistor element 2200. The potential applied to the first transistor element 2100 is approximately independent from the potential between the source terminal 252 and the drain terminal 254.

Figure 5B:
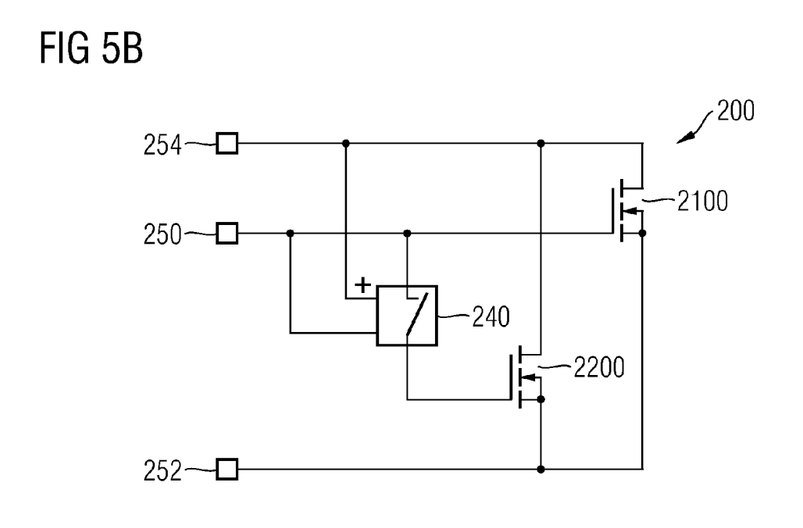

According to the configuration of FIG. 5B, the control element 240 of the semiconductor device 200 is connected with the gate terminal 250 and the drain terminal 254. According to this configuration, the control element 240 is configured to control the potential applied to the second transistor element 2200 based on a signal measured between the gate terminal 250 and the drain terminal 254.

According to a further embodiment, these two implementations may be combined. To be more specific, both the drain-source voltage and the drain-gate voltage may be used as an input of the control element 240.

FIGS. 5C to 5G illustrate specific implementations by way of equivalent circuit diagrams, of the control element 240.

Figure 5C:
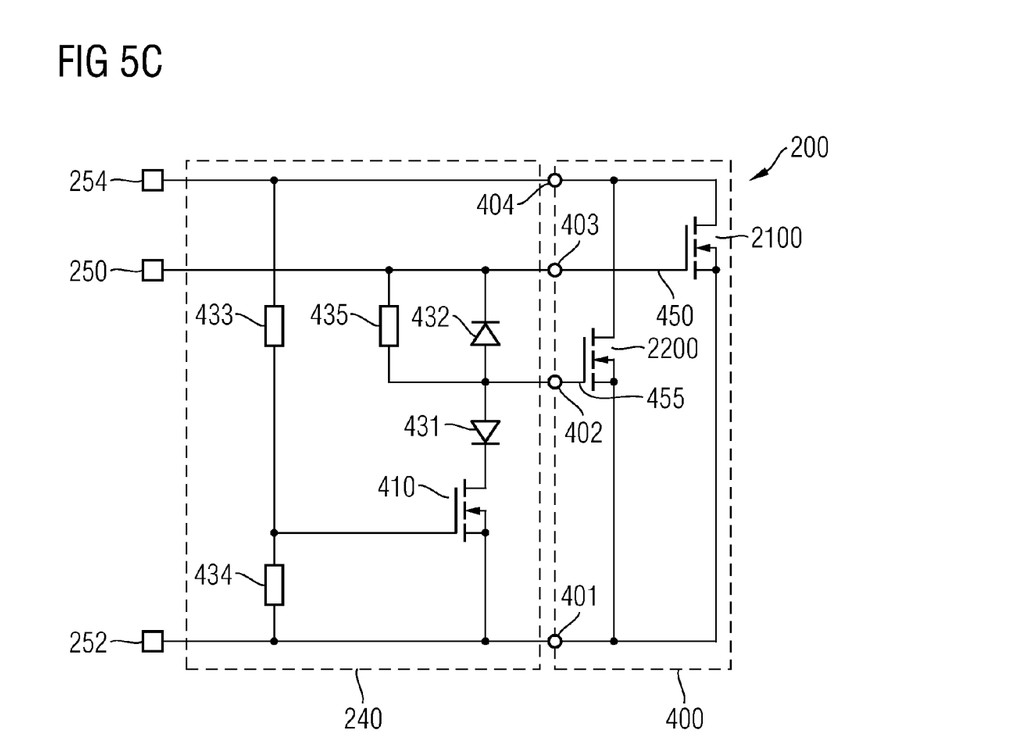

According to one implementation, the control element 240 may be implemented as a device integrated with or separated from the transistor array. In other words, the equivalent circuit of FIG. 5C representing the control element 240 may be implemented on the same semiconductor substrate as the transistor array so as to implement the semiconductor device 200. For example, resistors may be implemented by conductive paths such as polysilicon circuit paths having a certain resistivity which may be adjusted by setting a doping concentration. Further elements may be implemented by correspondingly doped regions.

Alternatively, the semiconductor device 400 may be implemented by the transistor array only, further comprising a control element 240 that may be integrated with a controller, for example, or another device or may be implemented as an adapter which is disposed between the controller and the transistor array.

The semiconductor device 400 illustrated in FIG. 5C to 5G includes a transistor array as illustrated in FIGS. 1A to 1C and 2. The semiconductor device 400 comprises a first gate conductive line 450 in contact with a gate electrode of the first transistor element 2100 and a second gate conductive line 455 in contact with a gate electrode of the second transistor element 2200. The semiconductor device 400 further comprises a local source terminal 401, a local drain terminal 404, a first gate terminal 403 in contact with the first gate conductive line 450 and a second gate terminal 402 in contact with the second gate conductive line 455. The local source terminal 401 may be connected with a source terminal 252 of the complete semiconductor device 200 via the control element 240. The local drain terminal 404 may be connected with the drain terminal 254 of the complete device 200 via the control element 240. The first gate terminal 403 may be connected with the gate electrode 250 of the complete semiconductor device 200 via the control element 240. Further, the control element 240 is configured to control the voltage applied to the second gate terminal 402.

In the embodiment of FIG. 5C, the control element 240 may comprise a transistor 410, diodes 431, 432 and resistors 433, 434, 435. The elements of the control element 240 implement the functionality according to which the potential applied to the second gate terminal 402 is controlled based on a signal measured between the drain terminal 254 and the source terminal 252.

In the embodiment of FIG. 5C, the transistor 410 may be implemented as a NMOS transistor. The control element 240 of FIG. 5C comprises an inverter to which a signal is input via a voltage divider (resistors 433, 434). For example, the resistance values of the resistors are selected so that on one side the transistor 410 is switched on at a voltage above a switching voltage between drain and source. For example, the resistance values of the resistors 433, 434, 435 may be in a range of approximately 100 to 1000 kΩ. Nevertheless, the maximum gate-source voltage of transistor 410 may not be exceeded. Optionally, diodes may be arranged in series with resistor 434. The resistance value of resistor 433 and the input capacitance of transistor 410 may determine the switching dynamics. For example, the input capacitance of transistor 410 may be very small, and the resistivity of resistor 433 may be selected to be large. As a consequence, a leakage current between drain and source may be reduced.

When $V_{DS}$ is lowered below a certain limit or the switching voltage, transistor 410 is set to an off-state and the second gate electrodes of the second transistor element 2200 are charged via resistor 435 and the second gate terminal 402. For example, the resistance value of resistor 435 may be selected relatively high so that a control element 340 may be used in combination with usually employed Hot-Swap controllers delivering current in a certain range. For example, the diode 432 may quickly discharge the voltage applied at the local second gate terminal 402. When the controller outputs a negative gate voltage, diode 431 prevents the occurrence of leakage currents. According to the configuration shown in FIG. 5C, the control element 240 is operable to switch on the second transistor elements 2200 at low values of $V_{DS}$ in order to achieve a low $R_{DS,ON}$.

Figure 5D:
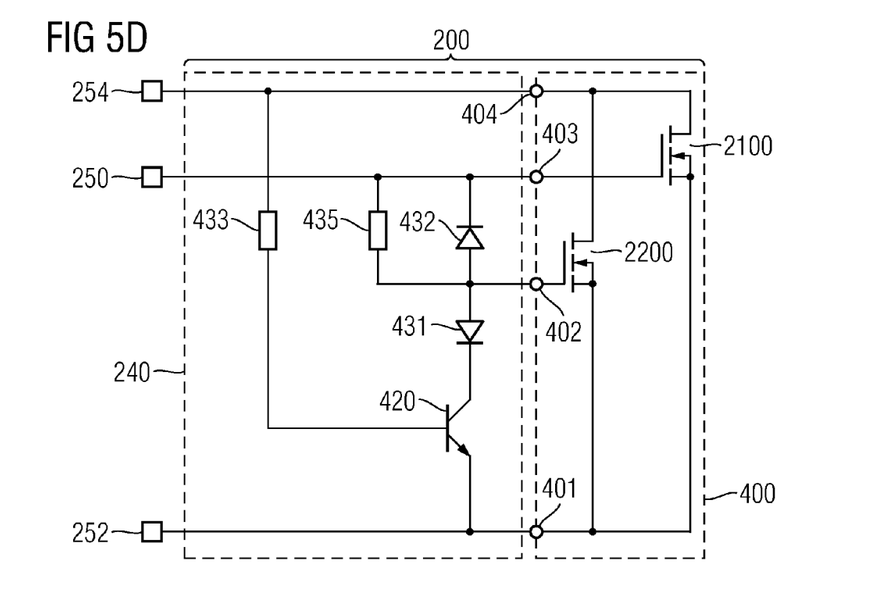

According to a further modification as illustrated in FIG. 5D, the control element 240 may comprise an NPN bipolar transistor 420 instead of the NMOS transistor 410. The further elements of FIG. 5D are similar to those employed according to FIG. 5C. In the embodiment of FIG. 5D, the diode 431 may be omitted.

Figure 5E:
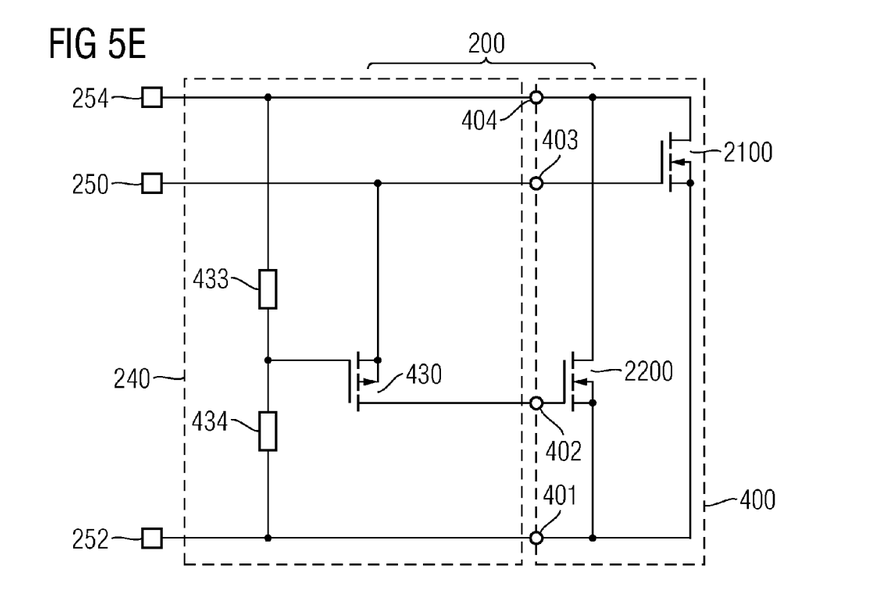

FIG. 5E shows yet a further example in which the transistor 430 may be implemented as a p-channel MOSFET. According to the embodiment of FIG. 5E, the second gate terminal 402 is connected with the drain region of the transistor 430. According to a modification, a further high-ohmic resistor may be disposed between the source electrode and the gate electrode of the second transistor element 2200. In this case, for example, the gate electrode of the second transistor element 2200 can discharge when the first transistor element 2100 is switched on or if the drain-source voltage is ramped at already positive gate voltage.

Figure 5F:
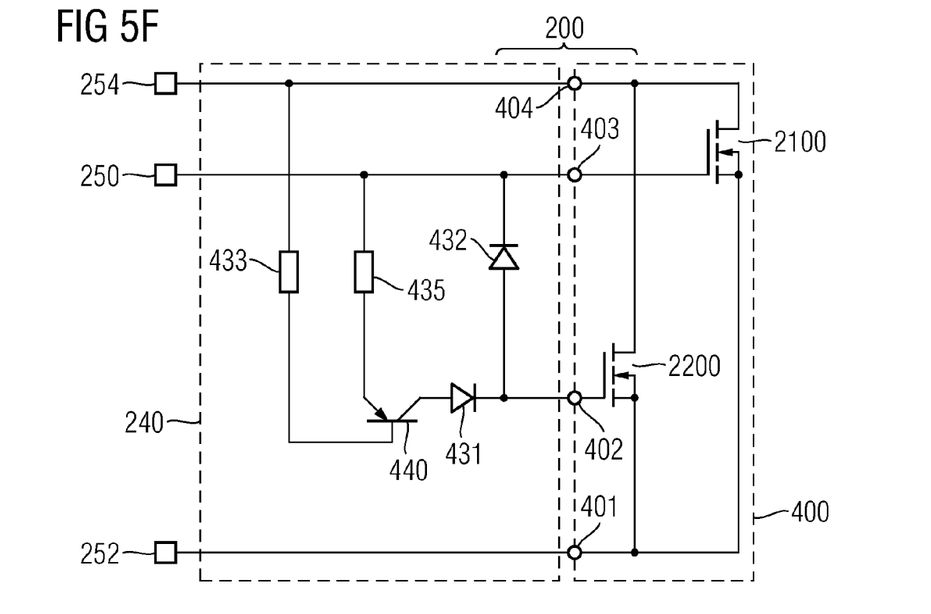

FIG. 5F shows a further embodiment, comprising a PNP bipolar transistor 440. According to this embodiment, leakage currents $I_{DSS}$ may be reduced. Further, a resistor may be disposed between the second gate terminal 402 and the source terminal 401. For example, thereby, the gate electrode of the second transistor element 2200 may be prevented from charging when the first transistor element 2100 is switched on. The resistor 435 is optional and may limit the current of transistor 440.

In the examples above, by setting, for example, the switching voltage of the transistors 410, 420, 430, 440, the switching drain-source voltage may be determined, at which the second transistor element 2200 is switched on or switched off.

Figure 5G:
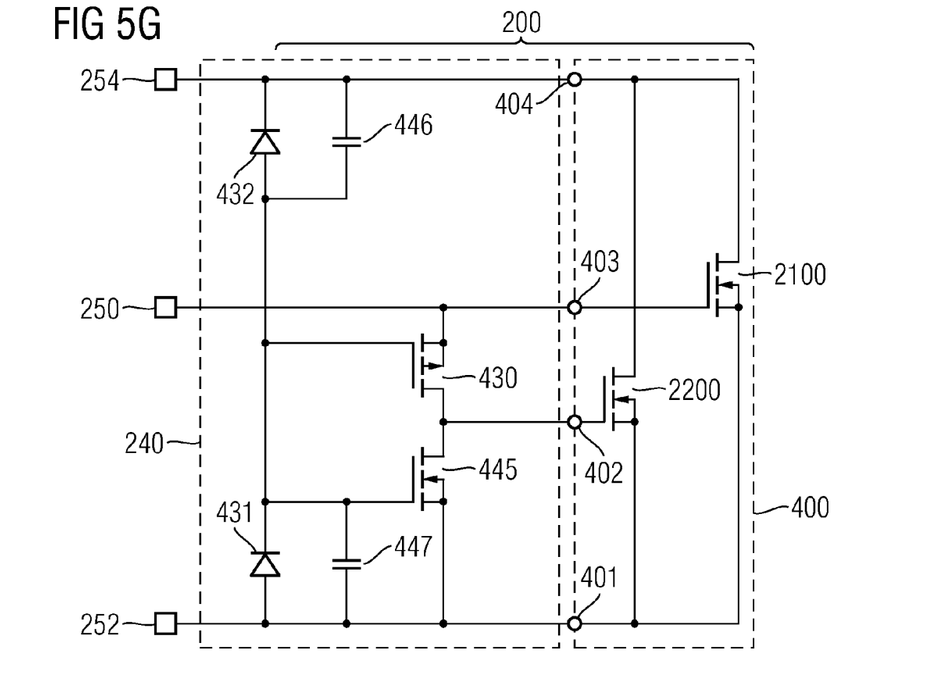

FIG. 5G shows a further example of a configuration of the control element 240. According to this configuration, the control element 240 may comprise two diodes 431, 432, two capacitors 447, 446, a PMOS transistor 430 and an NMOS transistor 445. According to this embodiment, the PMOS transistor 430 is the main switching element. The gate terminal of the PMOS transistor 430 is connected to the center node of a capacitive voltage divider between the drain and source terminal. The capacitive voltage divider comprises capacitors 447, 446. Diodes 431, 432 are connected parallel to the capacitors 447, 446, respectively, allowing fast charging and discharging of the gate-source capacitance of the PMOS transistor 430. The NMOS transistor 445 which may be very small in size, allows to discharge the gate of transistor 2200 without the penalty of leakage currents during on-state at low $V_{DS}$ voltages.

Example 2

A further embodiment relates to an integrated circuit or semiconductor device in which a power transistor is integrated with further circuit elements, for example current sensors, temperature sensors and others. In such a semiconductor device, a current limitation may be implemented by measuring the current in the power MOSFET on-chip with the current sensor and by adjusting the gate-source voltage $V_{GS}$ to regulate the current to $I_{CL}$.

For example, the limit value of the current, $I_{CL}$, may be in a range of approximately 10 A to 100 A. Due to this limitation, the chip may be protected from destruction due to self-heating during fault conditions such as short circuit and overload. Even with such a current limitation the chip may still heat-up during fault conditions but at a slower rate than without it. Once a critical maximum temperature is reached, the over-temperature protection circuit may turn the transistor off. For example, such a maximum temperature may be approximately 170° C.

When the power transistor is operated above the temperature compensation point TCP, the drain current, $I_D$, is distributed by and largely homogeneously over the power MOSFET. Below the TCP, the drain current is inhomogeneously distributed. As a consequence, current and temperature filaments are formed. In more detail, at a temperature above the temperature compensation point, the current is distributed homogeneously across the power MOSFET area, and the placement of the current sensor for current measurement is uncritical. During a short-circuit event, the drain current is limited to $I_{CL}$ and the temperature in the power MOSFET rises. Since $dI_D/dT$ is negative, $V_{GS}$ increases as the temperature rises.

However, at a temperature below the temperature compensation point, such a limitation of the drain current is difficult to achieve. In particular, the current distribution in the power MOSFET is not homogeneous. It has been observed that there exist current density differences between center and edge of the power MOSFET of up to a factor of 3. Further, a concentration of current and power density around the hot spot is developing. On one side, this results in a faster temperature rise than is expected from the measured temperature sensor signal and from purely thermal models. On the other side, the current sensor signal is not proportional to $I_D$. For example, if the current sensor is placed at the edge of the power MOSFET device, the actual signal $I_D$ is significantly higher than the one determined from the measured sensor signal. Hence, the power dissipation will increase during the pulse and temperature will rise faster than intended. If the arrangement is poor, the current limitation may not work at all.

For example, current limitation is implemented with several steps. At higher $V_{DS}$, $I_{CL}$ is lower, limiting the power dissipation at high $V_{DS}$. This is shown schematically in FIG. 6A. Product requirements may force $I_{CL}$ below the temperature compensation point at high $V_{DS}$ for products with low on-resistance at comparatively low currently limitation requirements.

Figure 6A:
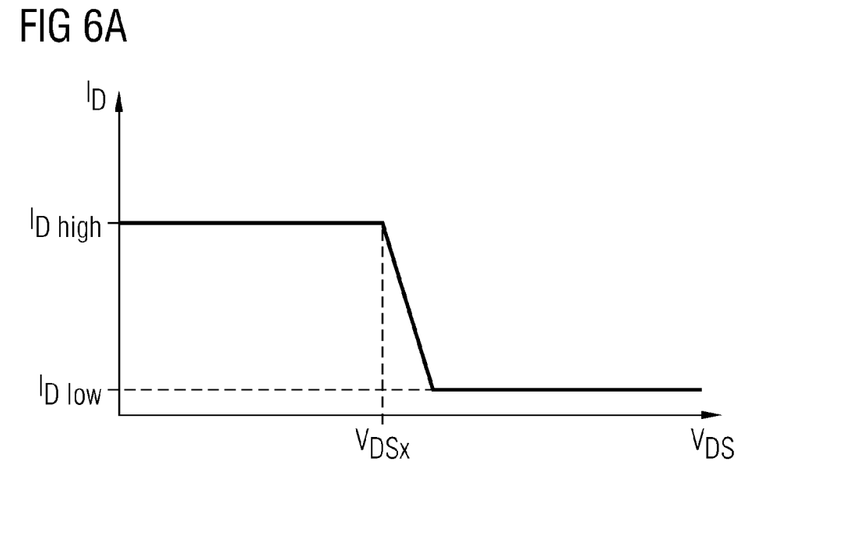
FIG. 6A shows an example of an I-V diagram of a semiconductor device according to an embodiment.
Figure 6B:
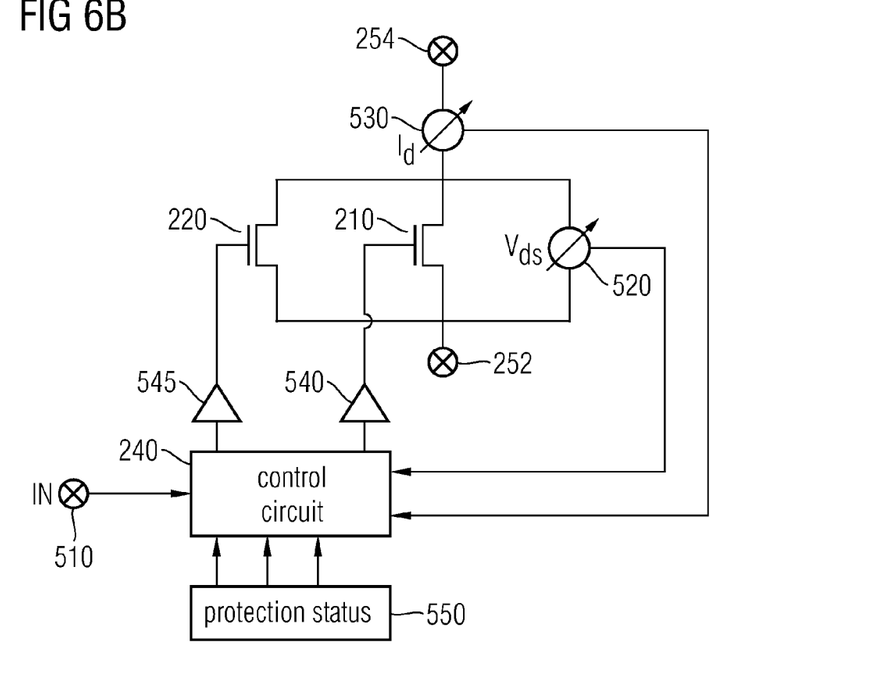
FIG. 6B shows a further diagram illustrating elements of a semiconductor device according to an embodiment.

FIG. 6B shows a further embodiment of a semiconductor device. According to the embodiment shown in FIG. 6B, each gate of the first and the second transistors 210, 220 is driven by its own gate driver 540, 545. The gate drivers 540, 545 are controlled by the control circuit block or control element 240 that evaluates the input signal input at the input terminal 510, the signal of an $I_D$ sensor 530, a $V_{DS}$ sensor 520 and the status of protection circuitry 550. According to this embodiment, the control element 240 achieves a complex functionality, including various functions of controlling the semiconductor device, e.g. by controlling the gate drivers 540, 545. This may be effected based on a variety of signals such as the signal of the $I_D$ sensor 530, the $V_{DS}$ sensor 520, the protection circuitry 550 and, for example, a temperature sensor. For example, the control element 240 may be implemented as a mixed signal circuit, i.e. comprising analog and digital circuits on a single semiconductor chip. For example, the control element 240 may comprise a plurality of transistors, for example, more than 100, in order to achieve the desired functionality. The semiconductor device shown in FIG. 6B further comprises a drain terminal 254 which may be connected with a battery and a source terminal 252 which may be the output terminal.

The first and second transistors 210, 220 have the construction that has been explained above with reference to FIGS. 1 and 2. In these configurations, the number of first trenches may be approximately equal to the number of second trenches. During regular operation, the first and the second gate electrodes are driven in an identical manner and the first and the second transistors have the same device area, channel width and device characteristics as the regular power MOSFET. Further, the first and second transistors 210, 220 are approximately equal to each other. The on-resistance ($R_{on} \cdot A$) is as low for the present device as for a regular power MOSFET. However, during current limitations, the two gate electrodes, in particular, the two gate conductive lines 230, 235 are no longer driven in an identical manner. For an average short circuit current density $j_{CL}=I_{CL}/w$, below the current density of the temperature compensation point, $j_{TCP}=I_{TCP}/w$, one of the two gate electrodes is turned off completely. The other gate electrode is used to regulate the current by adjusting its $V_{GS}$. Due to the feature that the control element controls a potential applied to the second gate electrode, the control element is operable to reduce the effective channel width, w, if certain $V_{DS}$ steps are exceeded. Since the channel width of the present power transistor is significantly reduced compared to a regular power transistor of the same area, the current density in the channel of the present power transistor and the associated $V_{GS}$ are significantly higher. As a consequence, current filamentation and all associated issues do not affect the split-gate power transistor. The control circuit 240 may regulate $I_D$ by controlling the $V_{GS}$. By reducing the channel width $V_{GS}$ can stay above the temperature compensation point even for large MOSFET areas.

According to this embodiment, the split-gate power MOSFET comprises at least two regions which may be inter-digitated. Each such region has a gate driver 540, 545, which are controlled by the control logic or control element 240. The control element 240 adjusts the gate-source voltages of the different regions such that all regions contribute to the $R_{ON}$ during normal operation. During current limitation, the control element is configured to switch-off the second transistor thereby reducing the active channel width of the MOSFET. As a consequence, the active regions of the MOSFET operate above the temperature compensation point TCP.

According to an embodiment, every n-th trench may be connected to one of the gate conductive lines. In this case, the channel width W1 of the transistor is $W_1=W/n$. A first order estimate of the gate-source voltage in such a case is given by the following equation:

$$(V_{gs,split-gate} - V_{th}) = \sqrt{n} \cdot (V_{gs,regular} - V_{th}) \geq (V_{TCP} - V_{th})$$

Hence, the gate overdrive during current limitation is increased by a factor of $\sqrt{n}$ if any n-th gate is active. The square-root behaviour is due to the non-linearity of the transfer-characteristics of the MOSFET. The factor n needs to be chosen such that the gate overdrive is sufficient to operate the MOSFET above its temperature compensation point.

The semiconductor device has a comb-like structure resulting in an improved heat transfer properties as has been explained above.

According to an implementation, the split-gate power device may be separated into two devices, i.e. the first and the second transistors 210, 220, by the control element 240 which drives both gates identically during normal operation. In a current limitation mode the current of the power MOSFET may be measured. In dependence from the current, the gate voltage $V_{GS}$ of the power MOSFET may be regulated to a constant value resulting in a constant output current.

To limit the overall power dissipation, the current limitation value may be reduced over $V_{ds}$, as is also illustrated in FIG. 6A. For example, if $V_{ds}$ is smaller than a predetermined voltage, both gate electrodes may be driven identically. If $V_{ds}$ is larger than the predetermined voltage, the second transistor 220 is switched off. Further, the first transistor 210 may be operated in a current limitation mode. According to a further example, a voltage applied to the first gate electrode 215 of the first transistor 210 may be reduced.

According to a further embodiment, the concept of the present embodiments may be repeated. For example, the semiconductor device may further comprise a third gate electrode which is disposed in a third trench and the first, second and third trenches may be controlled independently from each other. Further gate electrodes may be present.

While embodiments of the invention have been described above, it is obvious that further embodiments may be implemented. For example, further embodiments may comprise any sub-combination of features recited in the claims or any sub-combination of elements described in the examples given above. Accordingly, this spirit and scope of the appended claims should not be limited to the description of the embodiments contained herein.

What is claimed is:

1. A semiconductor device, comprising:
   a transistor array comprising first transistors and second transistors, gate electrodes of the first transistors being disposed in first trenches in a first main surface of a semiconductor substrate, gate electrodes of the second transistors being disposed in second trenches in the first main surface;
   a first gate conductive line in contact with the gate electrodes in the first trenches;
   a second gate conductive line in contact with the gate electrodes in the second trenches; and
   a control element configured to control the potential applied to the second gate conductive line.

2. The semiconductor device according to claim 1, wherein the control element is configured to control the potential applied to the second gate conductive line based on at least one of a signal between two terminals of the semiconductor device, a current flowing across the semiconductor device and a temperature of the semiconductor device.

3. The semiconductor device according to claim 1, further comprising:
   a source terminal; and
   a drain terminal,
   wherein the potential applied to the second gate conductive line is configured to be controlled based on a signal between the source terminal and the drain terminal.

4. The semiconductor device according to claim 1, further comprising:
   a gate terminal connected with the first gate conductive line;
   a source terminal; and
   a drain terminal,
   wherein the control element is configured to control the potential applied to the second gate conductive line based on a signal between the gate terminal and the drain terminal.

5. The semiconductor device according to claim 1, further comprising a gate terminal connected to the first gate conductive line.

6. The semiconductor device according to claim 4, wherein the control element is configured to apply the potential applied to the gate terminal to the second gate conductive line.

7. The semiconductor device according to claim 1, wherein the first and second trenches are arranged in an alternating manner.

8. The semiconductor device according to claim 1, wherein a number of first trenches is approximately equal to a number of second trenches.

9. The semiconductor device according to claim 1, wherein a number of the first trenches is smaller than a number of the second trenches, and wherein the first and second trenches are arranged so that one of the second trenches is disposed at either side of one of the first trenches.

10. The semiconductor device according to claim 9, wherein the number of second trenches is approximately five times the number of first trenches or greater.

11. The semiconductor device according to claim 1, wherein the control element is configured to control the potential applied to the first gate conductive line.

12. The semiconductor device according to claim 1, wherein the first and the second gate conductive lines are arranged in an alternating manner so as to extend in a direction perpendicular with respect to an extension direction of the first and second trenches.

13. The semiconductor device according to claim 1, wherein the first and second trenches are identical in structure.

14. The semiconductor device according to claim 1, wherein components of the control element are formed in the semiconductor substrate.

15. A semiconductor device, comprising:
   a transistor array comprising first transistors and second transistors, each of the first and second transistors comprising a gate electrode, the gate electrodes of the first transistors being disposed in first trenches in a first main surface of a semiconductor substrate, the gate electrodes of the second transistors being disposed in second trenches in the first main surface, the first and the second trenches being disposed in parallel to each other;
   a first gate conductive line in contact with the gate electrodes in the first trenches;
   a second gate conductive line in contact with the gate electrodes in the second trenches;
   a source terminal;
   a drain terminal;
   a first gate terminal in contact with the first gate conductive line; and
   a second gate terminal in contact with the second gate conductive line.

16. The semiconductor device according to claim 15, wherein the first and second trenches are arranged in an alternating manner.

17. The semiconductor device according to claim 15, wherein a number of the first trenches is approximately equal to a number of the second trenches.

18. The semiconductor device according to claim 15, wherein a number of the first trenches is smaller than a number of the second trenches, and wherein the first and second trenches are arranged so that one of the second trenches is disposed at either side of one of the first trenches.

19. The semiconductor device according to claim 15, wherein the first and the second gate conductive lines are arranged in an alternating manner so as to extend in a direction perpendicular with respect to an extension direction of the first and second trenches.

20. The semiconductor device according to claim 15, wherein the first and second trenches are identical in structure.

21. An integrated circuit, comprising:
- a semiconductor device including a transistor array comprising first transistors and second transistors, gate electrodes of the first transistors being disposed in first trenches in a first main surface of a semiconductor substrate, gate electrodes of the second transistors being disposed in second trenches in the first main surface;
- a first gate conductive line in contact with the gate electrodes in the first trenches;
- a second gate conductive line in contact with the gate electrodes in the second trenches; and
- a control element configured to control the potential applied to the second gate conductive line.

22. The integrated circuit according to claim 21, wherein the control element is configured to control the potential applied to the second gate conductive line based on at least one of a signal between two terminals of the semiconductor device, a current flowing across the semiconductor device and a temperature of the semiconductor device.

23. The integrated circuit according to claim 21, wherein the control element is configured to receive at least one of a current signal of a current flowing across the semiconductor device, a voltage signal of a voltage applied to two terminals of the semiconductor device, and a temperature signal of a temperature of the semiconductor device.

24. The integrated circuit according to claim 21, wherein the control element is implemented as a mixed signal circuit comprising at least 100 transistors.

25. The integrated circuit according to claim 21, wherein the control element comprises at least one transistor.

* * * * *